United States Patent [19]

Aiki et al.

[11] 4,025,939
[45] May 24, 1977

[54] SEMICONDUCTOR LASER DEVICE AND A METHOD FOR FABRICATING THE SAME

[75] Inventors: Kunio Aiki, Hachioji; Michiharu Nakamura, Nishitama; Jun-Ichi Umeda, Hachiouji, all of Japan

[73] Assignee: Hitachi, Ltd., Japan

[22] Filed: Aug. 20, 1975

[21] Appl. No.: 606,053

[30] Foreign Application Priority Data

June 11, 1975 Japan .............................. 50-69544

[52] U.S. Cl. .................................. 357/18; 357/17; 331/94.5 H; 357/16

[51] Int. Cl.² .................. H01L 33/00; H01S 33/19; H01L 29/161

[58] Field of Search ....................... 357/17, 18, 16; 331/94.5 H

[56] References Cited

UNITED STATES PATENTS 3,733,561  5/1973  Hayashi ............................ 331/94.5

OTHER PUBLICATIONS

H. Casey et al, *Appl. Phys. Lett.*, vol. 27, No. 3, Aug. 1, 1975 pp. 142–144.
M. Nakamuru, A. Yariv, et al, 1974 International Electron Devices Meeting, Technical Digest, Dec. 9–11, 1974, Wash. D. C. pp. 88–90.
Yariv et al, *Appl. Phys. Let.*, vol. 27, No. 3, Aug. 1, 1975 pp. 145–146.
Nakamuro, et al, *Appl. Phys. Lett.*, vol. 25, No. 9, Nov. 1, 1974, pp. 487–488.

*Primary Examiner*—Martin H. Edlow
*Attorney, Agent, or Firm*—Craig & Antonelli

[57] ABSTRACT

A semiconductor laser device comprises an n-type GaAs layer, an n-type GaAlAs layer disposed on the n-type GaAs layer, an optical confinement region comprising a laser active region consisting of GaAs disposed on the n-type GaAlAs layer, a first p-type GaAlAs region whose aluminum content is less than that of the n-type GaAlAs layer, disposed on said laser active region and a second p-type GaAlAs region whose aluminum content is less than that of the first p-type GaAlAs region, the surface of which opposite that disposed on said first p-type GaAlAs region is a periodically corrugated surface, a p-type GaAlAs layer whose aluminum content is more than that of said first p-type GaAlAs region, disposed on the periodically corrugated surface of the second p-type GaAlAs region, a p-type GaAs layer disposed on said p-type GaAlAs layer, and electrodes disposed on the n-type and p-type GaAs layers, respectively, and which has a very low threshold value for laser oscillation and which is fabricated with a very high yield rate.

47 Claims, 5 Drawing Figures

SEMICONDUCTOR LASER DEVICE AND A METHOD FOR FABRICATING THE SAME

BACKGROUND OF THE INVENTION

1. Field of the Invention

The present invention relates to a semiconductor laser device and a method for fabricating the same, and, more particularly, to a semiconductor laser device which can be integrated with other semiconductor elements and a method for fabricating the same.

2. Brief Description of the Prior Art

In a conventional semiconductor laser device consisting of a laser medium which provides gain and a resonator structure which provides a feedback necessary for a build-up of laser oscillation, the resonator structure is composed of at least two plane surfaces which are parallel to each other and are usually formed by cleaving the laser medium, such as GaAs, GaP, etc.

This kind of semiconductor laser, however, has drawbacks such that an integration with other semiconductor elements, such as transistors, diodes, optical waveguides, etc. in one semiconductor body becomes very difficult, since the cleavage technique should be introduced to form the cavity resonator; and that a control of a wavelength generated therefrom becomes difficult, since the wavelength is determined by the length of the resonator which is defined by cleaved surfaces of the laser medium and it is very difficult to provide an accurate distance between cleaved surfaces.

In the field of semiconductor laser devices, it, therefore, has been desired to provide a semiconductor laser device which can be integrated with other semiconductor elements and the wavelength of which can be easily controlled.

There has been proposed a new type of a semiconductor laser device which is called a distributed feedback laser and which is capable to satisfy the above-mentioned needs ("Applied Physics Letters," Vol. 18, No. 4, February 1971, pp. 152 – 154), and this semiconductor laser device has been developed and reported in "Applied Physics Letters", Vol. 22, No. 10, May 1973, pp. 515 – 516, and "Applied Physics Letters", Vol. 23, No. 5, September 1973, pp. 224 – 225.

The distributed feedback laser has a structure such that a surface of a laser active layer is periodically corrugated. The periods of the corrugations are determined by a desired laser wavelength to be emitted from the laser device, since a laser wavelength $\lambda$ of the laser device becomes $$\lambda = 2 S n/m,$$

wherein $S$ is the spatial period of the corrugation, $n$ is the effective refractive index of the laser active layer and $m$ is an integer.

At the corrugated surface, however, there are many nonradiative recombination centers created during the fabrication of the corrugations at the surface of the laser active layer. Therefore, the distributed feedback laser has such a drawback that a threshold value for laser oscillation becomes high.

For solving such a drawback, there has been proposed a semiconductor laser device including a carrier confinement region, an optical confinement region and a corrugations disposed at an interface between the optical confinement region and a semiconductor layer having a lower refractive index than that of the material of the optical confinement region, to effectively lock in light within the optical confinement region. To be concrete, the semiconductor laser device comprises a GaAs semiconductor body of a first conductivity type having a major surface, a laser active region disposed on said major surface of said body, a GaAlAs semiconductor region of a second conductivity type, opposite said first conductivity type, and having a band gap wider than that of said laser active region, disposed on said laser active region, the surface of said GaAlAs semiconductor region opposite that disposed on said laser active region being corrugated, and a GaAlAs semiconductor layer of said second conductivity type, disposed on the corrugated surface of said GaAlAs semiconductor region and having a refractive index lower than that of said GaAlAs semiconductor region. In this concrete semiconductor laser device, the carrier confinement region consists of the laser active region, and the optical confinement region consists of the laser active region and the GaAlAs semiconductor region. This semiconductor laser device and its fabrication are described in detail in U.S. Patent Application, Ser. No. 512,969, assigned to the same assignee of this patent application.

This semiconductor laser device, however, has the drawback that the device is fabricated with a low yield rate, since, on the corrugations formed on the surface of the GaAlAs semiconductor region, the GaAlAs semiconductor layer is formed with a very low degree of reproducibility, and since, for obtaining the GaAlAs semiconductor layer on the corrugated surface of the GaAlAs semiconductor region with a high degree of reproducibility, there should be employed a molecular-beam epitaxial method which is described in detail in "Journal of Vacuum Science and Technology," Vol.8, No. 5, September/October 1971, pp. S31 – S38, and "Applied Physics Letters", Vol. 25, No. 5, September 1974, pp. 288 – 290, and which should be controlled with very high-degree epitaxial growth techniques.

SUMMARY OF THE INVENTION

An object of the present invention, therefore, is to provide a distributed feedback laser which can be fabricated with a high yield rate.

Another object of the present invention is to provide a distributed feedback laser which can be integrated with other monolithic circuit components, whose wavelengths can be easily controlled and which has a low threshold value.

The objects mentioned above are accomplished by providing an optical confinement region comprising a laser active region, a first semiconductor region disposed on said laser active region and having a wider band gap than that of the material of the laser active region for confining carriers within said laser active region, and a second semiconductor region disposed on said first semiconductor region and having a band gap wider than or equal to that of said laser active region, the surface of said second semiconductor region being periodically corrugated.

It is preferable in the present invention to make the thicknesses of the laser active region, the first semiconductor region and the second semiconductor region between 0.1 $\mu$m and 0.5 $\mu$m, 0.05 $\mu$m and 0.3 $\mu$m and 0.1 $\mu$m and 0.2 $\mu$m, respectively.

It is further preferable in the present invention to use $Ga_{1-x}Al_xAs$, $Ga_{1-y}Al_yAs$ and $Ga_{1-z}Al_zAs$ for the laser active region, the first semiconductor region and the second semiconductor region, wherein $0 \leq x \leq z < y$, preferably $0 \leq x < z < y$.

Other objects, features and advantages of the present invention will be apparent from the following detailed description of some preferred embodiments thereof taken in conjunction with the accompanying drawings wherein like reference numerals are used to denote like parts.

BRIEF DESCRIPTION OF THE DRAWINGS

FIG. 1b is a graph showing an intensity distribution of a light beam in the embodiment shown in FIG. 1a.

DETAILED DESCRIPTION

Figure 1B:
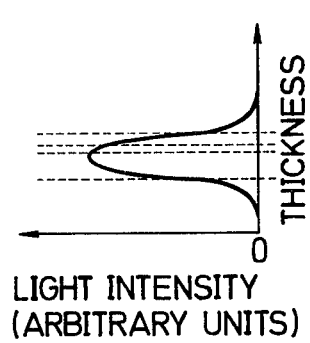
Figure 1A:
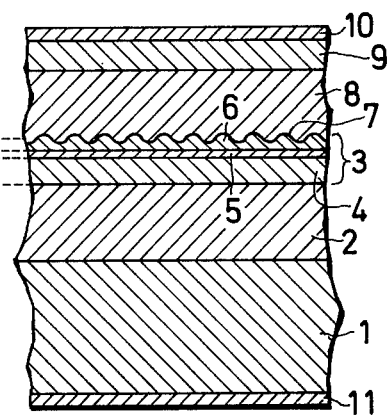
FIG. 1a is a schematic sectional view of one embodiment of the present invention.

Referring to FIG. 1a showing schematically one embodiment of the distributed feedback laser according to the present invention in sectional view, on a major surface of an n-type GaAs body 1 doped with Te whose impurity concentration is about $1 \times 10^{18}$ cm$^{-3}$, a first semiconductor layer 2 consisting of an n-type $Ga_{0.7}Al_{0.3}As$ is disposed, an optical confinement region 3, consisting of an n-type GaAs whose impurity concentration is about $5 \times 10^{17}$ cm$^{-3}$ and which is a laser active region 4, a first semiconductor region 5 consisting of a p-type $Ga_{0.83}Al_{0.17}As$, a second semiconductor region 6 consisting of a p-type $Ga_{0.93}Al_{0.07}As$ whose surface 7 opposite that on the first semiconductor region 5 is a periodically corrugated surface, is disposed on said first semiconductor layer 2, a second semiconductor layer 8 consisting of a p-type $Ga_{0.7}Al_{0.3}As$ is disposed on the periodically corrugated surface 7, a third semiconductor layer 9 consisting of a p-type GaAs is disposed on the second semiconductor layer 8, and a metal layer 10 consisting of gold containing germanium and nickel and a metal layer 11 consisting of chromium and gold are disposed on the third semiconductor layer 9 and on the other surface opposite the major surface of the GaAs body 1, respectively.

The thicknesses of the first semiconductor layer 2, the laser active region 4, the first semiconductor region 5, the second semiconductor region 6, the second semiconductor layer 8 and the third semiconductor layer 9 are 2 μm, 0.3 μm, 0.1 μm, 0.2 μm, 2 μm and 1 μm, respectively. The period and the depth of the corrugations disposed on the surface 7 of the second semiconductor region 6 are 0.12 μm and 800 Å, respectively. GaAs has a refractive index $n_{GaAs} = 3.6$; $Ga_{0.7}Al_{0.3}As$ has a refractive index $n_{Ga_{0.7}Al_{0.3}As} = 3.4$; $Ga_{0.83}Al_{0.17}As$ has a refractive index $n_{Ga_{0.83}Al_{0.17}As} = 3.48$; and $Ga_{0.93}Al_{0.07}As$ has a refractive index $n_{Ga_{0.93}Al_{0.07}As} = 3.55$. GaAs has a band gap $E_{GaAs} = 1.44$; $Ga_{0.7}Al_{0.3}As$ has a band gap $E_{Ga_{0.7}Al_{0.3}As} = 1.80$; $Ga_{0.83}Al_{0.17}As$ has a band gap $E_{Ga_{0.83}Al_{0.17}As} = 1.62$; And $Ga_{0.93}Al_{0.07}As$ has a band gap $E_{Ga_{0.93}Al_{0.07}As} = 1.52$.

In this distributed feedback laser, since the laser active region 4 is sandwiched by the first semiconductor layer 2 which has a wider band gap than that of the laser active region 4 and the first semiconductor region 5 which also has a wider band gap than that of the laser active region 4, carriers, such as holes and electrons, are confined and efficiently recombined within the laser active region 4, and hence the threshold current density is lowered; since the optical confinement region 3, consisting of the laser active region 4, the first semiconductor region 5 and the second semiconductor region 6, whose refractive index is determined by the mean value of the refractive indices of the laser active region 4, the first semiconductor region 5 and the second semiconductor region 6, is sandwiched by the first and second semiconductor layers 2 and 8, each of which has a lower refractive index than said mean value of refractive indices, the light beam due to the recombination of the carriers is effectively confined within the optical confinement region 3; and since the surface 7 of the second semiconductor region 6 is periodically corrugated and the light beam reaches to the periodically corrugated surface 7, the light beam is diffracted by the periodically corrugated surface 7 according to Bragg's Law and hence a feedback for lasing is attained.

FIG. 1b shows an intensity distribution of confined light in the semiconductor laser device shown in FIG. 1a. As is apparent from FIG. 1b, the light is effectively confined within the optical confinement region 3.

The distributed feedback laser having the above structure is fabricated in a manner as will be described below.

On a major surface of an n-type GaAs body 1 having a thickness of about 400 μm, an n-type $Ga_{0.7}Al_{0.3}As$ of 2 μm in thickness doped with Sn, a p-type GaAs of 3 μm in thickness doped with Ge, a p-type $Ga_{0.83}Al_{0.17}As$ of 0.1 μm in thickness doped with Ge, and a p-type $Ga_{0.93}Al_{0.07}As$ of 0.2 μm doped with Ge are successively grown by a well known liquid phase epitaxial method. Then, a photoresist layer is formed on the surface of the p-type $Ga_{0.93}Al_{0.07}As$, and a pair of ultraviolet light beams from a common source are directed onto the photoresist layer so that interference fringes are formed on the surface of said photoresist layer. When the photoresist layer is developed, a photoresist having a periodically corrugated surface is obtained. This technique is described in detail in Applied Optics, Vol. 12, Page 455 (1973). After that, the resultant crystal is introduced into an ion milling machine and is etched by ions, thereby forming a resultant crystal having a periodically corrugated surface 7 of the p-type $Ga_{0.93}Al_{0.07}As$.

On the periodically corrugated surface, a p-type $Ga_{0.7}Al_{0.3}As$ layer of 2 μm in thickness doped with Ge and a p-type GaAs layer of 1 μm doped with Ge are grown by the well known liquid phase epitaxial method. Finally, a metal layer consisting of gold containing germanium and nickel and a metal layer consisting of chromium and gold are evaporated on the surface of the p-type GaAs layer and of the GaAs body, respectively, for providing electrodes about 1 μm thick.

According to this method for fabricating the distributed feedback laser device, the semiconductor layer is easily grown on the corrugated surface of the second semiconductor region even by employing the conventional liquid phase epitaxial method, and hence the device is fabricated with a high yield rate.

Figure 2:
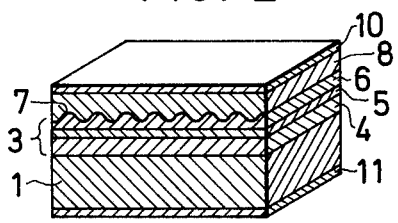
FIGS. 2 through 4 are schematic perspective views of other embodiments of the present invention.

Referring to FIG. 2 which is a schematic perspective view of another embodiment of the present invention, on a major surface of an n-type GaAs body 1, an optical confinement region 3 consisting of a laser active region 4 consisting of an n-type GaAs having a thickness of about 0.2 μm, a first semiconductor region 5 about 0.06 μm thick, consisting of a p-type $Ga_{0.8}Al_{0.2}As$, a second semiconductor region 6 of 0.1 μm in thickness consisting of a p-type $Ga_{0.95}Al_{0.05}As$, whose surface opposite the first semiconductor region 5 is a periodically corrugated surface 7, and a second semiconductor layer 8 of a p-type $Ga_{0.6}Al_{0.4}As$ having a thickness of about 2 μm are successively disposed. A metal layer 11 consisting of gold and chromium and a metal layer 10 consisting of gold containing germanium and nickel are disposed on the other surface opposing to the major surface of the GaAs body 1 and on the second semiconductor layer 8, respectively.

In this distributed feedback laser device, the period and depth of the corrugations are 0.127 μm and 500 A, respectively and hence, the wavelength of a laser beam emitted therefrom is 8912 A. The threshold current density of this laser device is 2.5 KA/cm². $Ga_{0.8}Al_{0.2}As$, $Ga_{0.95}Al_{0.05}As$ and $Ga_{0.6}Al_{0.4}As$ have refractive indices of 3.46, 3.56 and 3.32, respectively, and have band gaps of 1.66, 1.49 and 1.95, respectively. In this distributed feedback laser device, the optical confinement region also consists of the laser active region 4 and the first and second semiconductor regions 5 and 6, although the light beam traverses the interface between the body 1 and the laser active region 4 since the materials are the same. (There are slightly different refractive indices between the body 1 and the laser active region 4 due to the different impurity concentration.)

Figure 3:
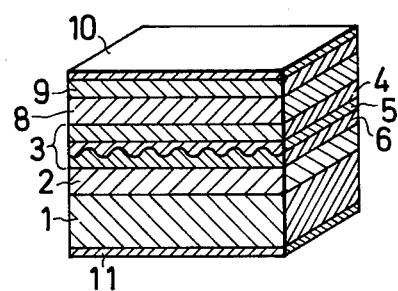

FIG. 3 is a schematic perspective view of still another embodiment of the present invention.

This distributed feedback laser device comprises an n-type GaAs body 1, a first semiconductor layer 2 consisting of an n-type $Ga_{0.6}Al_{0.4}As$ 2 μm thick disposed on said body, an optical confinement region 3 consisting of a second semiconductor region 6 consisting of an n-type $Ga_{0.93}Al_{0.07}As$ having a thickness of 0.15 μm, whose surface opposite to the first semiconductor layer 2 is periodically corrugated, a first semiconductor region 5 consisting of an n-type $Ga_{0.85}Al_{0.15}As$ having a thickness of 0.3 μm disposed on the corrugated surface of the second semiconductor region 6, and a laser active region 4 consisting of a p-type GaAs having a thickness of 0.3 μm disposed on the surface of the first semiconductor region 5, which is disposed on the surface of the first semiconductor layer 2, a second semiconductor layer 8 consisting of a p-type $Ga_{0.6}Al_{0.4}As$ of 2 μm thick disposed on the optical confinement region 3, a third semiconductor layer 9 consisting of a p-type GaAs of 1 μm thick disposed on the second semiconductor layer 8, and a metal layer 10 consisting of gold containing germanium and nickel and a metal layer 11 consisting of gold and chromium are disposed on the third semiconductor layer 9 and on the GaAs body 1, respectively.

In this distributed feedback laser device, the period and the depth of the corrugations are 0.127 μm and 500 A, respectively. From this laser device, a laser beam having a wavelength of 8896 A is emitted when a current density of at least 2 KA/cm² is applied to the laser active layer 4 through the electrodes 10 and 11.

This distributed feedback laser device is fabricated by the steps as follows.

An n-type $Ga_{0.6}Al_{0.4}As$ doped with Te, an n-type $Ga_{0.93}Al_{0.07}$ As doped with Te are formed successively on an n-type GaAs body by a conventional liquid phase epitaxy method. On the surface of the n-type $Ga_{0.93}Al_{0.07}$ As, a photoresist layer is formed, and ultra-violet light beams are directed onto said photoresist layer so that interference fringes are formed on the surface of said photoresist layer. When the photoresist layer is developed, a photoresist layer having a periodically corrugated surface is obtained. After that, the resultant crystal is introduced into an ion milling machine and is etched by accelerated ions, thereby forming a resultant crystal having a periodically corrugated surface on the n-type $Ga_{0.93}Al_{0.07}As$. An n-type $Ga_{0.85}Al_{0.15}As$ doped with Te and a p-type GaAs doped with Zn, a p-type $Ga_{0.6}Al_{0.4}As$ doped with Si and a p-type GaAs doped with Zn are successively grown on the corrugated surface of the n-type $Ga_{0.93}Al_{0.07}As$. Conductive layers of electrodes are formed on the p-type GaAs and on the GaAs body, respectively.

Figure 4:
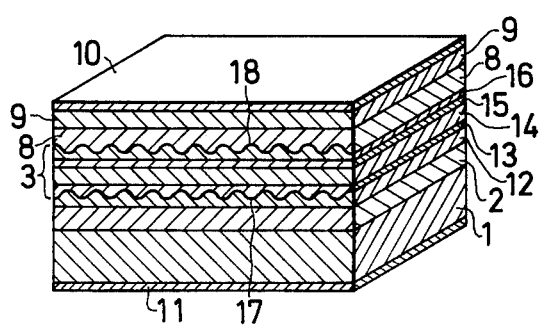

FIG. 4 is a schematic perspective view of a further embodiment of the present invention.

This distributed feedback laser device comprises an n-type GaAs body 1, a first semiconductor layer 2 consisting of an n-type $Ga_{0.7}Al_{0.3}As$ disposed on the body 1, an optical confinement region disposed on the first semiconductor layer 2, which consists of a third semiconductor region 12 consisting of an n-type $Ga_{0.93}Al_{0.07}As$ disposed on the first semiconductor layer 2, whose surface is a periodically corrugated surface (a first periodically corrugated surface 17), a fourth semiconductor region 13 consisting of an n-type $Ga_{0.85}Al_{0.15}As$ disposed on the first periodically corrugated surface 17 of the third semiconductor region 12, a laser active region 14 consisting of an n-type GaAs disposed on the fourth semiconductor region 13, a fifth semiconductor region 15 consisting of a p-type $Ga_{0.83}Al_{0.17}As$ disposed on the laser active region 14, and a sixth semiconductor region 16 consisting of a p-type $Ga_{0.93}Al_{0.07}As$ disposed on the fifth semiconductor region 15, whose surface opposite that disposed on the fifth semiconductor region 15 is a periodically corrugated surface (a second periodically corrugated surface 18), a second semiconductor layer 8 consisting of a p-type $Ga_{0.7}Al_{0.3}As$ disposed on the second corrugated surface of the sixth semiconductor region 16, a third semiconductor layer 9 consisting of a p-type GaAs disposed on the second semiconductor layer 8, and metal layers 10 and 11 disposed on the third semiconductor layer 9 and the GaAs body 1, respectively.

The period and a depth of each of the corrugations 17 and 18 are 0.127 μm and 500 A, and the phase of the corrugation 17 is in a reversed relation with that of the corrugation 18. The threshold current density of this distributed feedback laser device is 2.5 KA/cm², and the wavelength of this laser device is 8920 A.

In the above embodiments, although the phase of the corrugations are in a reversed relation with each other, corrugations having any phase relationship may be utilized. When the periods of the corrugations are different from each other, two laser beams having wavelengths different from each other are emitted from this semiconductor laser device.

Though in the above embodiments, the semiconductor material GaAlAs is utilized, another semiconductor materials may be utilized.

When an n-type $Ga_{0.7}Al_{0.3}As_{0.95}P_{0.05}$, a p-type $Ga_{0.83}Al_{0.17}As_{0.97}P_{0.03}$, a p-type $Ga_{0.93}Al_{0.07}As_{0.99}P_{0.01}$ and a p-type $Ga_{0.7}Al_{0.3}As_{0.95}P_{0.05}$ are utilized for the first semiconductor layer 2, the first semiconductor region 5, the second semiconductor region 6 and the second semiconductor layer 8 in the embodiment of FIG. 1a instead of the n-type $Ga_{0.7}Al_{0.3}As$, the p-type $Ga_{0.83}Al_{0.17}As$, the p-type $Ga_{0.93}Al_{0.07}As$ and the p-type $Ga_{0.7}Al_{0.3}As$, respectively, the distributed feedback laser device having a long operating life span since the lattice constants of these GaAlAsP crystals closely resemble those of GaAs utilized for the laser active material, and hence crystal defects are very slight.

When the first semiconductor layer 2 of the n-type $Ga_{0.7}Al_{0.3}As$, the first semiconductor region 5 of the p-type $Ga_{0.83}Al_{0.17}As$, the second semiconductor region 6 of the p-type $Ga_{0.93}Al_{0.07}As$ and the second semiconductor layer 8 of the p-type $Ga_{0.7}Al_{0.3}As$ in the embodiment of FIG. 1a are substituted by an n-type $GaAs_{0.6}P_{0.4}$, a p-type $GaAs_{0.3}P_{0.7}$, a p-type $GaAs_{0.5}P_{0.5}$ and a p-type $GaAs_{0.6}P_{0.4}$, respectively, a distributed feedback laser device is obtained, whose threshold current density is 3 KA/cm² and laser beam has a wavelength of 8860 A at room temperature.

The distributed feedback laser device is also obtained when the first semiconductor layer 2 of the n-type $Ga_{0.7}Al_{0.3}As$, the first semiconductor region 5 of the p-type $Ga_{0.83}Al_{0.17}As$, the second semiconductor region 6 of the p-type $Ga_{0.83}Al_{0.07}As$ and the second semiconductor layer 8 of the p-type $Ga_{0.7}Al_{0.3}As$ in the embodiment of FIG. 1a are substituted by n-type $Ga_{0.7}Al_{0.3}As_{0.8}Sb_{0.2}$, p-type $Ga_{0.83}Al_{0.17}As_{0.8}Sb_{0.2}$, p-type $Ga_{0.83}Al_{0.07}As_{0.8}Sb_{0.2}$ and p-type $Ga_{0.7}Al_{0.3}As_{0.8}Sb_{0.2}$, respectively.

As is apparent from the foregoing description, in the present invention, the optical confinement region, in which the light beam to be generated from the laser active region is effectively confined and which is constructed by disposing at at least one side thereof a material having a refractive index lower than that thereof (the mean value of the refractive indices of materials constructing the optical confinement region), is constructed by at least three semiconductor regions, that is, the laser active region which generates the light beam due to the recombination of carriers, the first semiconductor region which has a wider band gap than that of the laser active region, and the second semiconductor region which has a corrugated surface on one surface thereof and having a band gap wider than or equal to that of the laser active region.

The material for the second semiconductor region is a material on which a semiconductor crystal is easily grown even when the surface of the material is corrugated. For example, GaAs and GaAlAs whose aluminum contents are less than about 10 % are utilized for the second semiconductor region.

Though it is preferable in the present invention to use a material having a band gap wider than that of the material for the laser active region, for the second semiconductor region, a material having a band gap equal to that of the material for the laser active region, for the second semiconductor region at the sacrifice of the light-emitting efficiency due to the absorption of the light beam emitted from the laser active region at the second semiconductor region.

Explaining these requirements for the present invention utilizing GaAlAs system, the optical confinement region may be constructed by $Ga_{1-x}Al_xAs$ for the laser active region, $Ga_{1-y}Al_yAs$ for the first semiconductor region, and $Ga_{1-z}Al_zAs$ for the second semiconductor region, wherein $0 < x < z < y$, preferably $0 < x < z < y$. Preferable ranges of y and z are $0.1 < y < 0.2$ and $0 < z < 0.1$. Further, when $Ga_{1-w}Al_wAs$ is utilized for the semiconductor layers to construct the optical confinement region, that is, the first and second semiconductor layers 2 and 8 in the embodiment shown in FIG. 1a, the aluminum content in $Ga_{1-w}Al_wAs$ should be a value so that the refractive index of $Ga_{1-w}Al_wAs$ is lower than that of the optical confinement region. According to our experiments, when y and z are within the above-mentioned preferable ranges, a preferable range of w is $0.25 < w < 0.5$.

While the invention has been explained in detail, it is to be understood that the technical scope of the invention is not limited to that of the foregoing embodiments.

For example, although n- or n-type GaAs is utilized as the laser active region, other materials capable of a lasing function may be utilized; examples of such materials are $Ga_{1-x}Al_xAs$, $Ga_{1-x}Al_xAs_{1-y}P_y$, $In_{1-x}Al_xAs$, $Ga_{1-x}Al_xAs_{1-y}Sb_y$, and InGaP.

Further, preferable ranges of the thickness of the laser active region; the first, fourth and fifth semiconductor regions; and the second, third and sixth semiconductor regions are between 0.1 $\mu$m and 0.5 $\mu$m; 0.05 $\mu$m and 0.3 $\mu$m; and 0.1 $\mu$m and 0.2 $\mu$m, respectively.

Furthermore, the periods of the corrugations are not limited to the values in the embodiments, since the periods are determined by the desired laser wavelength to be emitted from the laser device, as described above.

According to the present invention, there is provided a distributed feedback laser device having a low threshold current density and operated at room temperature for continuous wave operation, and capable of being fabricated with a high yield rate.

While various embodiments have been described by way of example, it is apparent to those skilled in the art that many changes and modifications may be made therein without departing from the spirit of the appended claims.

What we claim is:

1. A semiconductor laser device comprising:
    a semiconductor body of a first conductivity type having a major surface;
    an optical confinement region disposed on said major surface of said body, and comprising
        a laser active region having a band gap $E_1$, disposed on said major surface;
        a first semiconductor region disposed on said laser active region, having a band gap wider than the band gap $E_1$ of the laser active region, and having a second conductivity type opposite said first conductivity type; and
        a second semiconductor region of said second conductivity type disposed on said first semiconductor region, having a band gap $E_2$, wherein $E_2 \geq E_1$, the surface of the second semiconductor region opposite that disposed on said first semiconductor region being periodically corrugated; and
    a semiconductor layer having said second conductivity type and having a refractive index lower than the mean value of the refractive indices of said laser active region, the first semiconductor region and the second semiconductor region, disposed on the corrugated surface of the second semiconductor region.

2. A semiconductor laser device according to claim 1, wherein the band gap $E_2$ of the second semiconductor region is wider than that $E_1$ of the laser active region.

3. A semiconductor laser device according to claim 1, wherein the thickness of the first semiconductor region is between 0.05 $\mu$m and 0.3 $\mu$m, and the thickness of the second semiconductor region is between 0.1 $\mu$m and 0.2 $\mu$m.

4. A semiconductor laser device according to claim 1, wherein the thickness of the laser active region is between 0.1 $\mu$m and 0.5 $\mu$m.

5. A semiconductor laser device according to claim 2, wherein the thickness of the first semiconductor region is between 0.05 $\mu$m and 0.3 $\mu$m, and the thickness of the second semiconductor region is between 0.1 $\mu$m and 0.2 $\mu$m.

6. A semiconductor laser device according to claim 2, wherein the thickness of the laser active region is between 0.1 $\mu$m and 0.5 $\mu$m.

7. A semiconductor laser device according to claim 5, wherein the thickness of the laser active region is between 0.1 $\mu$m and 0.5 $\mu$m.

8. A semiconductor laser device according to claim 1, wherein said laser active region consists of $Ga_{1-x}Al_xAs$, said first semiconductor region consists of $Ga_{1-y}Al_yAs$, and said second semiconductor region consists of $Ga_{1-z}Al_zAs$, wherein $0 \leq x \leq z < y$.

9. A semiconductor laser device according to claim 8, wherein the values of x, y and z are in the relation of $0 \leq x < z < y$.

10. A semiconductor laser device according to claim 8, wherein said y and z are within the ranges of $0.1 \leq y \leq 0.2$ and $0 < z < 0.1$.

11. A semiconductor laser device according to claim 9, wherein said y and z are within the ranges of $0.1 \leq y \leq 0.2$ and $0 < z < 0.1$.

12. A semiconductor laser device according to claim 10, wherein said semiconductor layer consists of $Ga_{1-w}Al_wAs$, wherein $0.25 \leq w \leq 0.5$.

13. A semiconductor laser device according to claim 11, wherein said semiconductor layer consists of $Ga_{1-w}Al_wAs$, wherein $0.25 \leq w \leq 0.5$.

14. A semiconductor laser device according to claim 9, wherein the thickness of the first semiconductor region is between 0.05 $\mu$m and 0.3 $\mu$m, and the thickness of the second semiconductor region is between 0.1 $\mu$m and 0.2 $\mu$m.

15. A semiconductor laser device according to claim 13, wherein the thickness of the first semiconductor region is between 0.05 $\mu$m and 0.3 $\mu$m, and the thickness of the second semiconductor region is between 0.1 $\mu$m and 0.2 $\mu$m.

16. A semiconductor laser device according to claim 1, which further comprises another semiconductor layer having said first conductivity type and having a refractive index lower than said mean value of refractive indices, disposed between said body and said optical confinement region.

17. A semiconductor laser device according to claim 2, which further comprises another semiconductor layer having said first conductivity type and having a refractive index lower than said mean value of refractive indices, disposed between said body and said optical confinement region.

18. A semiconductor laser device according to claim 17, wherein said laser active region consists of $Ga_{1-x}Al_xAs$, said first semiconductor region consists of $Ga_{1-y}Al_yAs$, and said second semiconductor region consists of $Ga_{1-z}Al_zAs$, wherein $0 \leq x \leq z < y$.

19. A semiconductor laser device according to claim 18, wherein said y and z are within the ranges of $0.1 \leq y \leq 0.2$ and $0 < z < 0.1$.

20. A semiconductor laser device according to claim 19, wherein said another semiconductor layer consists of $Ga_{1-w}Al_wAs$, wherein $0.25 \leq w \leq 0.5$.

21. A semiconductor laser device according to claim 20, wherein the thickness of the first semiconductor region is between 0.05 $\mu$m and 0.3 $\mu$m, and the thickness of the second semiconductor region is between 0.1 $\mu$m and 0.2 $\mu$m.

22. A semiconductor laser device according to claim 21, wherein the thickness of the laser active region is between 0.1 $\mu$m and 0.5 $\mu$m.

23. A semiconductor laser device according to claim 22, wherein said semiconductor body consists of GaAs.

24. A semiconductor laser device according to claim 23, which further comprises a GaAs layer of said second conductivity type disposed on said semiconductor layer.

25. A semiconductor laser device comprising:
a semiconductor body of a first conductivity type having a major surface;
an optical confinement region disposed on said major surface of the body, and comprising
a first semiconductor region of said first conductivity type disposed on said major surface of said body, the surface of said first semiconductor region opposite that disposed on said major surface being periodically corrugated;
a second semiconductor region of said first conductivity type disposed on said corrugated surface of said first semiconductor region; and
a laser active region having a band gap narrower than that of said second semiconductor region, disposed on said second semiconductor region; and
a first semiconductor layer of a second conductivity type opposite said first conductivity type, having a refractive index lower than the mean value of refractive indices of said laser active region and said first and second semiconductor regions, disposed on said optical confinement region.

26. A semiconductor laser device according to claim 25, which further comprises a second semiconductor layer of said first conductivity type having a refractive index lower than said mean value of refractive indices, disposed between said semiconductor body and said optical confinement region.

27. A semiconductor laser device according to claim 25, wherein said laser active region, said first semiconductor region and said second semiconductor region sonsist, respectively, of $Ga_{1-x}Al_xAs$, $Ga_{1-z}Al_zAs$ and $Ga_{1-y}Al_yAs$, wherein $0 \leq x \leq z < y$.

28. A semiconductor laser device according to claim 27, wherein the values of x, y and z are in the relation of $0 \leq x < z < y$.

29. A semiconductor laser device according to claim 28, wherein said y and z are within the ranges of $0.1 \leq y \leq 0.2$ and $0 < z < 0.1$.

30. A semiconductor laser device according to claim 26, wherein said laser active region, said first semiconductor region and said second semiconductor region consist, respectively, of $Ga_{1-x}Al_xAs$, $Ga_{1-z}Al_zAs$ and $Ga_{1-y}Al_yAs$, wherein $0 \leq x < z < y$, $0.1 \leq y \leq 0.2$ and $0 < z < 0.1$.

31. A semiconductor laser device according to claim 30, wherein said first and second semiconductor layers consist of $Ga_{1-w}Al_wAs$, wherein $0.25 \leq w \leq 0.5$.

32. A semiconductor laser device according to claim 31, which further comprises a GaAs layer of said second conductivity type disposed on said first semiconductor layer.

33. A semiconductor laser device according to claim 28, wherein the thickness of said first semiconductor region is between 0.1 μm and 0.2 μm, and the thickness of said second semiconductor region is between 0.05 μm and 0.3 μm.

34. A semiconductor laser device according to claim 33, wherein the thickness of said laser active region is between 0.1 μm and 0.5 μm.

35. A semiconductor laser device according to claim 32, wherein the thickness of said first and second semiconductor regions and of said laser active region are between 0.1 μm and 0.2 μm, 0.05 μm and 0.3 μm, and 0.1 μm and 0.5 μm, respectively.

36. A semiconductor laser device comprising:
 a semiconductor body of a first conductivity type having a major surface;
 an optical confinement region disposed on said major surface of the body, and comprising
  a first semiconductor region of said first conductivity type disposed on said major surface, the surface of said first semiconductor region opposite that disposed on said major surface being periodically corrugated;
  a second semiconductor region of said first conductivity type disposed on said corrugated surface;
  a laser active region having a band gap $E_1$ which is narrower than that of said second semiconductor region, disposed on said second semiconductor region;
  a third semiconductor region of a second conductivity type opposite said first conductivity type having a band gap wider than that of said laser active region, disposed on said laser active region; and
  a fourth semiconductor region of said second conductivity type having a band gap $E_2$ which is in a relation of $E_2 \geq E_1$, disposed on said third semiconductor region, the surface of said fourth semiconductor region opposing that disposed on said third semiconductor region being periodically corrugated; and
 a first semiconductor layer of said second conductivity type having a refractive index lower than a mean value of the refractive indices of said laser active region and said first, second, third and fourth semiconductor regions disposed on said corrugated surface of said fourth semiconductor region.

37. A semiconductor laser device according to claim 36, which further comprises a second semiconductor layer of said first conductivity type having a refractive index lower than said mean value of refractive indices, disposed between said semiconductor body and said optical confinement region.

38. A semiconductor laser device according to claim 36, wherein said laser active region; said first and fourth semiconductor regions; and said second and third semiconductor regions consist of $Ga_{1-x}Al_xAs$; $Ga_{1-z}Al_zAs$; and $Ga_{1-y}Al_yAs$, respectively, wherein $0 \leq x \leq z < y$.

39. A semiconductor laser device according to claim 38, wherein the values of $x$, $y$ and $z$ are in the relation of $0 \leq x < z < y$.

40. A semiconductor laser device according to claim 39, wherein said y and z are within the ranges of $0.1 \leq y \leq 0.2$ and $0 < z < 0.1$.

41. A semiconductor laser device according to claim 37, wherein said laser active region; said first and fourth semiconductor regions; and said second and third semiconductor regions consist of $Ga_{1-x}Al_xAs$; $Ga_{1-z}Al_zAs$; and $Ga_{1-y}Al_yAs$, respectively, wherein $0 \leq x < z < y$, $0.1 \leq y \leq 0.2$ and $0 < z < 0.1$.

42. A semiconductor laser device according to claim 41, wherein said first and second semiconductor layers consist of $Ga_{1-w}Al_wAs$, wherein $0.25 \leq w \leq 0.5$.

43. A semiconductor laser device according to claim 42, which further comprises a GaAs layer of said second conductivity type disposed on said first semiconductor layer.

44. A semiconductor laser device according to claim 39, wherein the thickness of said first and fourth semiconductor regions are between 0.1 μm and 0.2 μm, and the thicknesses of said second and third semiconductor regions are between 0.05 μm and 0.3 μm.

45. A semiconductor laser device according to claim 44, wherein the thickness of said laser active region is between 0.1 μm and 0.5 μm.

46. A semiconductor laser device according to claim 43, wherein the thicknesses of said first and fourth semiconductor regions are between 0.1 μm and 0.2 μm, the thicknesses of said second and third semiconductor regions are between 0.05 μm and 0.3 μm, and the thickness of the laser active region is between 0.1 μm and 0.5 μm.

47. A method for fabricating a semiconductor laser device comprising the steps of:
 preparing a semiconductor body of a first conductivity type having a major surface;
 forming a laser active region having a band gap $E_1$, a first semiconductor region of a second conductivity type, opposite said first conductivity type, having a band gap wider than that $E_1$ of the laser active region and a second semiconductor region of said second conductivity type having a band gap $E_2$, wherein $E_2 \geq E_1$, successively on the major surface of said body by a liquid-phase-epitaxy method;
 forming a photoresist layer on said second semiconductor region;
 directing a pair of ultra-violet light beams from a common source onto said photoresist layer so as to form interference fringes on the surface of said photoresist layer;
 developing said photoresist layer;
 etching said photoresist layer and the surface of said second semiconductor region by accelerated ions, whereby corrugations are formed on the surface of said second semiconductor region; and
 forming a semiconductor layer of said second conductivity type, having a refractive index lower than a mean value of the refractive indices of said laser active region and said first and second semiconductor regions, on the corrugated surface of said second semiconductor region, by said liquid-phase-epitaxy method.

* * * * *